(12) United States Patent
Sasaki

(10) Patent No.: US 9,442,398 B2
(45) Date of Patent: Sep. 13, 2016

(54) POSITION DETECTOR, LITHOGRAPHY APPARATUS, AND DEVICE MANUFACTURING METHOD

(71) Applicant: CANON KABUSHIKI KAISHA, Tokyo (JP)

(72) Inventor: Ryo Sasaki, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 9 days.

(21) Appl. No.: 13/964,238

(22) Filed: Aug. 12, 2013

(65) Prior Publication Data

US 2014/0055768 A1 Feb. 27, 2014

(30) Foreign Application Priority Data

Aug. 23, 2012 (JP) ................. 2012-184543

(51) Int. Cl.
*G03F 9/00* (2006.01)
*G01B 11/14* (2006.01)

(52) U.S. Cl.
CPC ............ *G03F 9/7065* (2013.01); *G01B 11/14* (2013.01); *G03F 9/70* (2013.01); *G03F 9/7003* (2013.01); *G03F 9/7046* (2013.01); *G03F 9/7069* (2013.01); *G03F 9/7088* (2013.01)

(58) Field of Classification Search
CPC ...... G03F 9/7088; G03F 9/70; G03F 9/7003; G03F 9/7046; G03F 9/7065; G03F 9/7069
See application file for complete search history.

(56) References Cited

U.S. PATENT DOCUMENTS 8,149,382 B2 4/2012 Hidaka et al.
2010/0129739 A1* 5/2010 Hidaka et al. ................. 430/30

FOREIGN PATENT DOCUMENTS

| CN | 101218482 A | 7/2008 |
| JP | 2000091219 A | 3/2000 |
| KR | 20080026121 A | 3/2008 |

OTHER PUBLICATIONS

Korean Office Action issued in Korean counterpart application No. KR10-2013-0097628, dated Jun. 19, 2015.
Taiwanese Office Action issued in Taiwan counterpart application No. TW102127415, dated Mar. 13, 2015. English translation provided.

* cited by examiner

*Primary Examiner* — Michelle M Iacoletti
(74) *Attorney, Agent, or Firm* — Rossi, Kimms & McDowell LLP

(57) ABSTRACT

A position detector configured to detect a position of an object to be detected. The position detector has an optical system configured to detect a mark on the object to be detected that includes a lens that has a positive refractive power, and a reflection member configured to reflect a light flux that passes through the lens in a convergent state or a divergent state. The reflection member is configured from at least one material of a material that exhibits a refractive index of less than 1.0 and an extinction coefficient of greater than 0.0, and a material that exhibits a refractive index of greater than 1.0 and an extinction coefficient of greater than 0.5.

8 Claims, 6 Drawing Sheets

POSITION DETECTOR, LITHOGRAPHY APPARATUS, AND DEVICE MANUFACTURING METHOD

BACKGROUND OF THE INVENTION

1. Field of the Invention

The present invention relates to a position detector, a lithography apparatus, and a device manufacturing method.

2. Description of the Related Art

A lithography apparatus such as an exposure apparatus, or the like forms a desired pattern on a substrate in a lithography process that forms part of a manufacturing processes for a semiconductor device, a liquid crystal display device, or the like. For example, the exposure apparatus transfers the pattern of the original plate (reticle or mask) onto a photosensitive substrate (such as a wafer or glass plate forming a resist layer on a surface) by use of a projection optical system. The exposure apparatus includes a position detector configured to acquire information in relation to the position of the substrate. The position detector acquires information in relation to the position of the substrate by detection of a mark formed on the substrate. For example, when an OA detection system (off-axis type alignment mark detection system) is used as the position detector, the optical axis of the OA detection system is separated from the optical axis of the projection optical system.

As a result, the alignment accuracy of a wafer relative to the projection optical system is reduced due to fluctuation in the optical axis distance (baseline) between those axes caused by environmental changes in the periphery of the OA detection system or the projection optical system. Japanese Patent Application Laid-Open No. 2000-91219 discloses a configuration in which an objective lens of the OA detection system is disposed in proximity to the optical axis of the projection optical system by use of a light path folding mirror (reflection unit). This configuration shortens the baseline between the projection optical system and the OA detection system, and thereby suppresses the reduction in the alignment accuracy by reducing the fluctuation amount in the baseline.

However, when light flux reflected from the mark on the substrate passes through the objective lens of the OA detection system in Japanese Patent Application Laid-Open No. 2000-91219, the light flux may become incident onto the light path folding mirror (reflection unit) in a convergent state or a divergent state. In this case, each light beam of the reflected light flux exhibits a different angle of incidence in relation to the reflection unit. As a result, a phase difference is produced between the light beams of the reflected light flux. Therefore, asymmetry is produced in the image that is detected by an image detection element (CCD or the like) of the OA detection system, or in the alignment mark signal resulting from photoelectric conversion of the image, and therefore, the position of the mark cannot be accurately detected.

SUMMARY OF THE INVENTION

The present invention provides, for example, a position detector configured to enable a reduction in the asymmetry of the alignment mark signal.

According to an aspect of the present invention, a position detector configured to detect a position of an object to be detected is provided that includes an optical system configured to detect a mark on the object to be detected. The optical system includes a lens that has a positive refractive power, and a reflection member configured to reflect a light flux that passes through the lens in a convergent state or a divergent state. The reflection member is configured from at least one material of a material that exhibits a refractive index of less than 1.0 and an extinction coefficient of greater than 0.0, and a material that exhibits a refractive index of greater than 1.0 and an extinction coefficient of greater than 0.5.

Further features of the present invention will become apparent from the following description of exemplary embodiments with reference to the attached drawings.

DESCRIPTION OF THE EMBODIMENTS

Hereinafter, preferred embodiments of the present invention will now be described with reference to the accompanying drawings.

Figure 1:
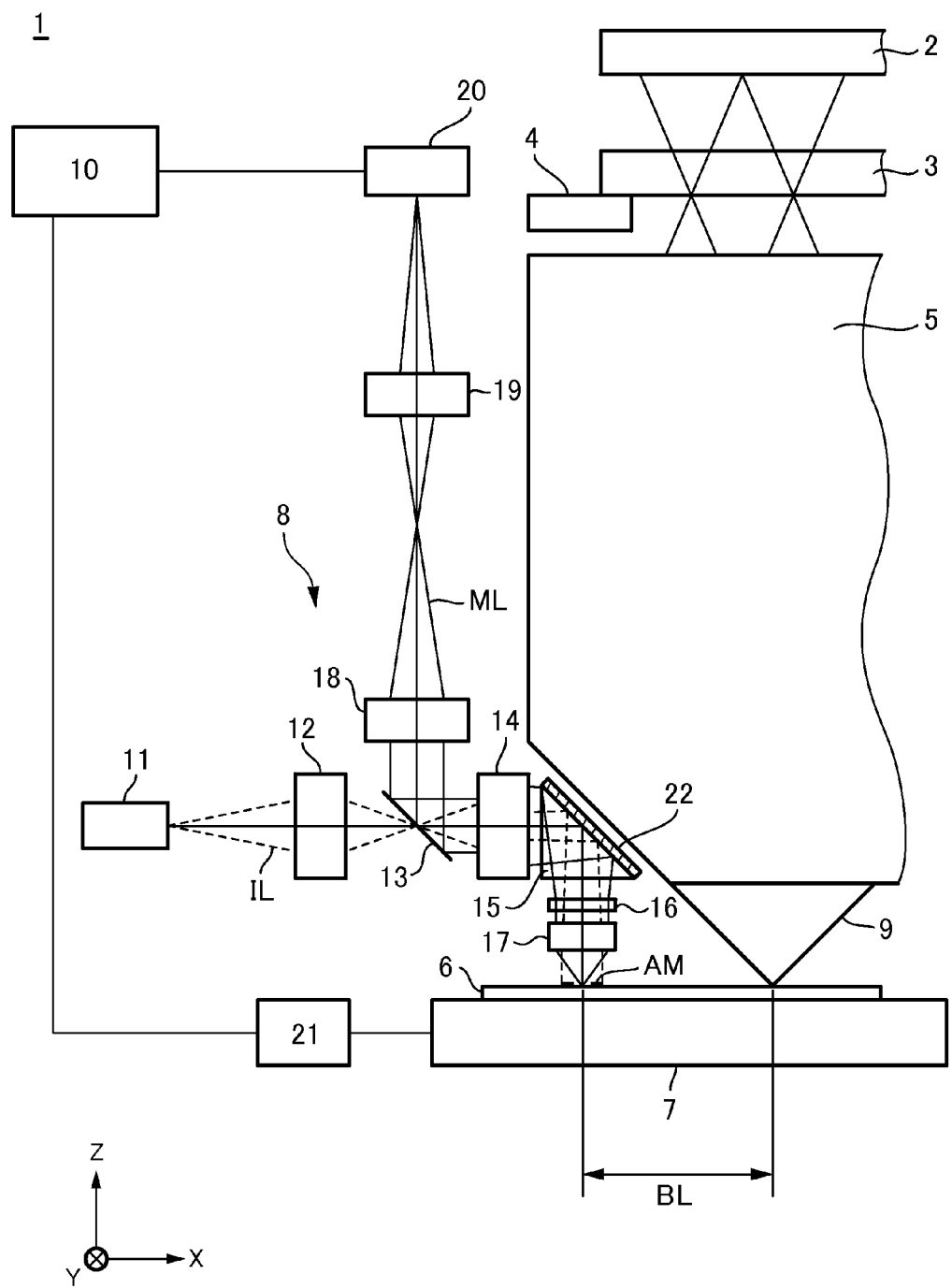
FIG. 1 is a diagram illustrating a schematic configuration of a position detector in a projection exposure apparatus of the present invention.

Firstly, the configuration of a lithography apparatus applying the position detector of the present invention will be described. This lithography apparatus is a device that is used in a lithography process that forms part of the manufacturing processes for a semiconductor device, a liquid crystal display, or the like, and in the present exemplary embodiment, the device is configured as an exposure apparatus that executes exposure processing of a wafer or a glass plate that is a substrate (substrate to be treated). FIG. 1 illustrates a schematic configuration of an exposure apparatus 1 according to the present embodiment. The description of FIG. 1 is such that the Z axis is taken to be parallel to the optical axis of the projection optical system, the Y axis is taken to be the scanning direction of the wafer during scanning and exposure in a plane that is perpendicular to the Z axis, and the X axis is the non-scanning direction that is orthogonal to the Y axis. The exposure apparatus 1 basically includes an illumination optical system 2, a reticle stage 4 configured to hold a reticle 3, a projection optical system 5, a wafer stage 7 configured to hold a wafer 6, and a control unit (not shown).

The illumination optical system (illumination system) 2 includes for example a lens, a mirror, a light integrator, or a diaphragm, or the like, and is configured to adjust the light illuminated from a light source (not illustrated) to thereby illuminate the reticle 3. The light source includes for example use of a laser. The laser that can be used as a light source is an ArF excimer laser having a wavelength of approximately 193 nm, a KrF excimer laser having a wavelength of approximately 248 nm, or the like. The type of laser is not limited to an excimer laser, and for example a YAG laser may be used. Furthermore, there is no limitation to the number of lasers. When a laser is used as the light source, it is preferred to use a light flux shaping optical system configured to shape a parallel light flux from a laser oscillator into a desired beam configuration, or an incoherent optical system that makes an incoherent configuration of a coherent laser. Furthermore, the light source that can be used may use a light source such as one or a plurality of mercury lamps, or xenon lamps, or the like.

The reticle 3 is an original plate of quartz glass, and forms a pattern to be transferred (for example, a circuit pattern). Furthermore, the reticle stage (original plate holder) 4 is moveably supported in the XY direction on the reticle stage guide (not shown), and holds the reticle 3. The projection optical system 5 projects the pattern on the reticle 3 illuminated by exposure light from the illumination optical system 2 with a predetermined magnification (for example, ½-⅕) onto the wafer 6. The projection optical system 5 may adopt an optical system (catadioptric optical system) configured from at least one concave mirror and a plurality of optical elements, or an optical system configured only from a plurality of refractive elements (lens or the like). Alternatively, the projection optical system 5 may adopt an optical system configured from diffractive optical elements such as at least one kinoform and a plurality of lens, or an all mirror optical system, or the like.

The reticle 3 is illuminated with light from the illumination optical system 5. The projection optical system projects the pattern formed on the reticle with a predetermined magnification (for example, ¼, or ⅕) onto the wafer 6 using light that is incident from the reticle 3.

The wafer 6, for example, is a substrate that is formed from monocrystalline silicon and which has a surface coated with a resist, and may be configured as a second wafer or the like on which the pattern is already formed. The wafer stage (holder) 7 mounts and retains the wafer 6 and can be driven in the XY axial direction.

The control unit controls the adjustment and operation or the like of the respective constituent elements of the exposure apparatus 1. The control unit for example is configured by a computer or the like, is connected through a circuit to the respective constituent elements of the exposure apparatus 1, and executes control of the respective constituent elements in accordance with a program or the like. The control unit may have a configuration of integration with another portion of the exposure apparatus 1 (in a common housing), or may be configured as a separate component to the other portions of the exposure apparatus 1 (in a separate housing).

The exposure apparatus 1 includes an off-axis type mark detection system (hereinafter referred to as an "alignment mark detection system" or an "OA detection system") 8 as a position detector. For example, when a second wafer is used as the wafer 6, the position of the wafer 6 must be detected in advance (position of body to be detected). The method of position detection generally adopts an OA detection system in which the position of an alignment mark (mark) AM on the wafer 6 (body to be detected) is disposed at a position that is different from the position of the projection optical system, and is detected without use of the projection optical system, and then positioning of the wafer 6 is performed based on the detection result. More specifically, a reticle alignment mark detection system (not illustrated) disposed above (or below) the reticle 3 is used to position the reticle 3 on the reticle stage 4 so that the center of the reticle pattern coincides with the optical axis of the projection optical system. 5 and the optical axis of the illumination optical system 2. The length of the detection center (optical axis) of the OA detection system from the optical axis 9 of the projection optical system is termed the baseline B. L. The position information for the alignment mark is obtained by detection of the alignment mark AM formed on the wafer after displacement to the detection position of the OA detection system. Actual alignment is performed on the basis of a calculation performed by the calculation processing unit 10 based on the position information for the alignment mark AM obtained from the OA detection system 8 and the position information of the wafer stage 7 obtained from an interferometer.

The operation of the OA detection system of the exposure apparatus according to the present embodiment will be described below. The light IL that is emitted from the illumination light source 11 of the OA detection system may be configured as a convergent light flux or a divergent light flux, and after passing through the illumination optical system 12 of the OA detection system, the flux becomes incident upon the polarized beam splitter 13. A P-polarized component (component that is parallel to the face of the page) relative to the polarized beam splitter 13 of the light that is incident on the polarized beam splitter 13 passes through, and becomes incident on a second optical system (second lens group) 14. Thereafter, the light IL that passes through the second optical system 14 is reflected by the reflection mirror (optical member, reflection portion) 15, and is oriented downwards in a direction that is perpendicular relative to the wafer 6. A λ/4 plate 16 is disposed under the reflection mirror 15, and the light that passes through the λ/4 plate is converted to circularly polarized light. Then, after passing through a first optical system (first lens group) 17 that includes a lens that has a positive refractive power (positive lens), the alignment mark AM on the wafer 6 is subjected to Kohler illumination. The objective lens is included in the first optical system 17. The detection light ML that is the reflected light from the alignment mark AM is oriented again from the body to be detected to the first optical system 17, passes through the λ/4 plate 16 and is converted from circularly polarized light to linearly polarized light of an S-polarized component (component perpendicular to the face of the page) by the λ/4 plate 16. Then, the detection light ML is guided to the reflection mirror 15, passes through the second optical system 14, is reflected by the polarized beam splitter 13, and guided to a relay lens 18. The detection light ML guided to the relay lens 18 passes through the detection optical system 19 and an alignment mark signal is detected by the image detection element 20. The position of the wafer 6 is calculated by the calculation processing unit 10 based on the alignment mark signal detected by the image detection element 20 and the position of the wafer stage 7. The calculation result is used to operate a driving mechanism 21 of the wafer stage 7 and to position the wafer 6.

The image detection element 20 may be a two dimensional image detection element, or a one dimensional image detection element. When configured as a two dimensional image detection element, bidirectional positional detection in both the X and Y directions of the alignment mark on the wafer is enabled by a single detection system. When a one dimensional image detection element is used, a pair of detection systems having the same configuration may be adapted by disposing one in the zero degree direction and the other in a direction rotated by 90 degrees.

Figure 2:
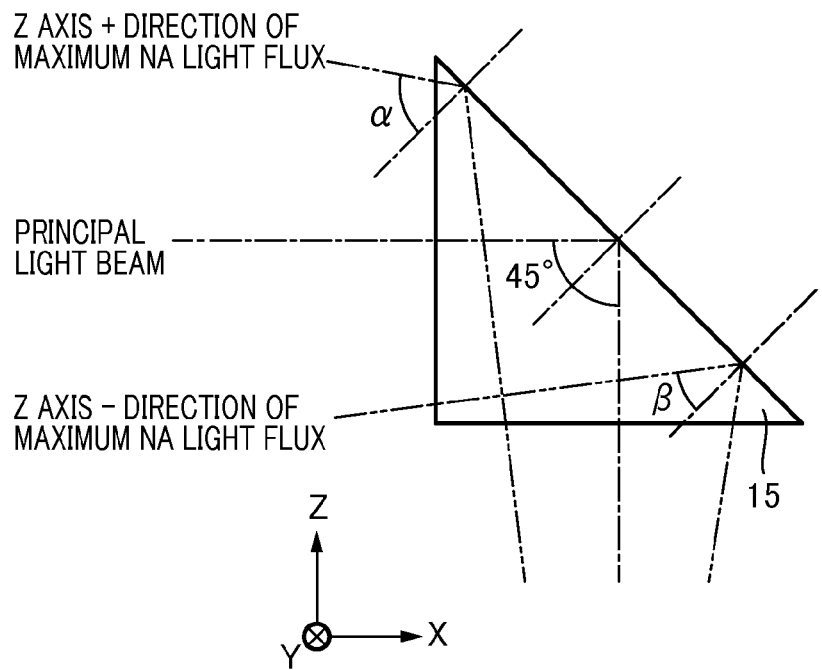
FIG. 2 is a diagram illustrating a reflection mirror and an incident light flux in the XZ cross section.
Figure 3:
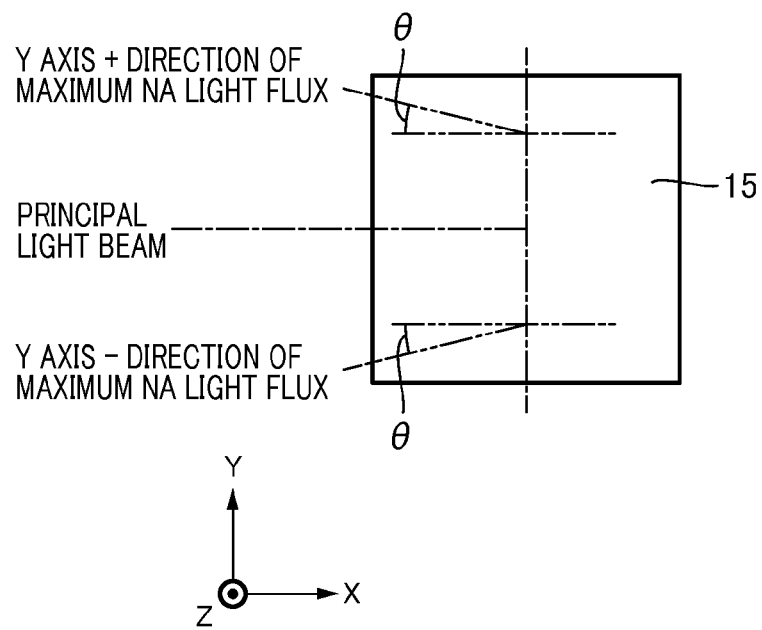
FIG. 3 is a diagram illustrating a reflection mirror and an incident light flux in the XY cross section.
Figure 4:
FIG. 4 is a diagram illustrating a difference between a reflection phase and an angle of incidence of the reflection mirror.
Figure 5:
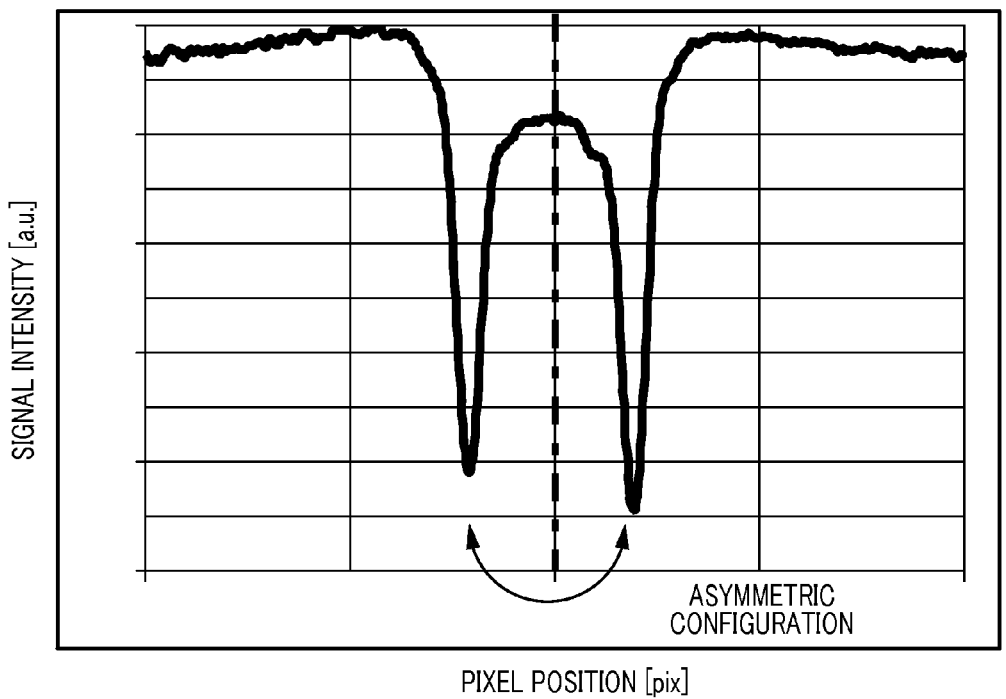
FIG. 5 is a diagram illustrating an alignment detection waveform in the configuration of FIG. 4.

The OA detection system is designed to execute Kohler illumination on the mark AM through the second optical system 14, the reflection mirror 15, and the first optical system 17, and to dispose the reflection mirror 15 in a non-parallel light flux (divergent light flux). As a result, the respective light beams that illuminate the wafer 6 become incident at different angles relative to the reflection surface Refl of the reflection mirror 15. FIG. 2 and FIG. 3 illustrate the relationship of the respective NA light beams and the reflection surface Refl. FIG. 2 illustrates the light path on the XZ sectional surface, and FIG. 3 illustrates the light path on the XY sectional surface. As illustrated in FIG. 2 and FIG. 3, light is incident and is reflected in a state in which the angle of incidence of the respective NA light beams and the principal light beam is different (convergent state) relative to the reflection mirror that is disposed in the convergent light flux. The optical characteristics of the respective incident light fluxes that are received from the reflection surface Refl differ in response to the angle of incidence, and therefore, after reflection on the reflection mirror 15, each light flux exhibits different optical characteristics (reflectance, reflection phase). FIG. 4 is a graph that illustrates the change in the reflection phase relative to the angle of incidence, and illustrates that the reflection phase of the reflection light undergoes a large change when the angle of incidence of the reflection surface Refl changes, and thereby the phase change amount received from the reflection surface Refl changes in relation to the respective NA light beams illustrated in FIG. 2 and FIG. 3. The alignment mark AM on the wafer 6 is illuminated with the illumination light that exhibits different a reflection phase in each light beam. Furthermore, the detection light ML from the alignment mark AM becomes incident in a divergent state as a non-parallel light flux (divergent light flux) relative to the reflection mirror 15, and is reflected with a different reflection phase for each light beam. Therefore, as illustrated in FIG. 5, the alignment mark signal detected by the image detection element 20 exhibits asymmetrical characteristics. Although an example of a divergent light flux has been described above, in the same manner, when light is incident upon the reflection mirror 15 in a convergence light flux, each light beam exhibits a different reflection phase.

Figure 6:
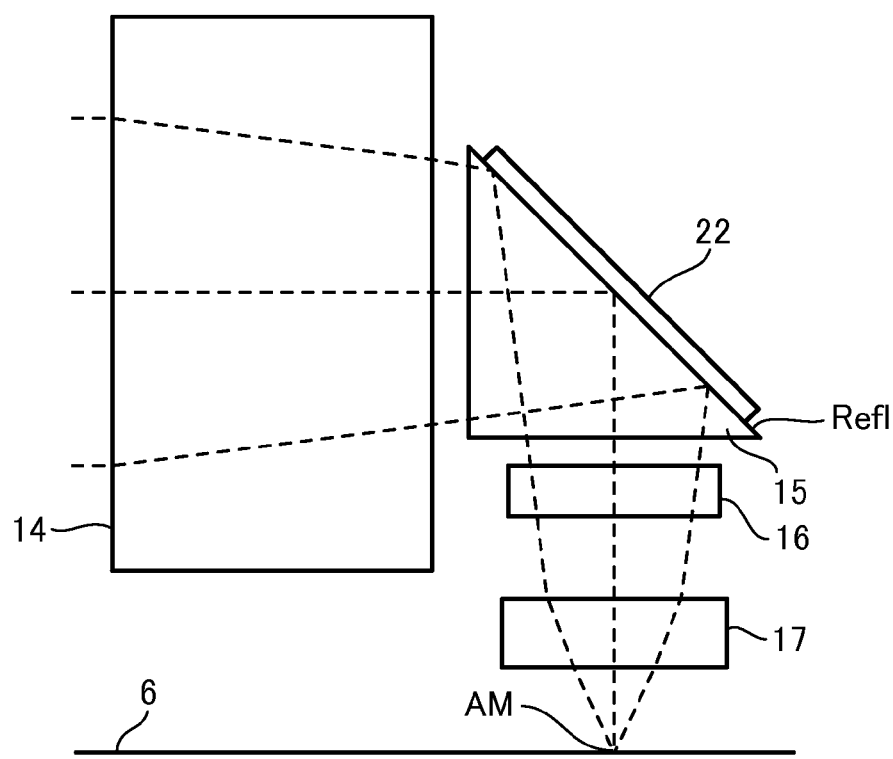
FIG. 6 is a diagram illustrating a reflection mirror according to an exemplary embodiment of the present invention.

The reflection mirror (reflection portion) 15 of the OA detection system 8 according to the present embodiment includes a reflective member 22 that exhibits properties such that the refractive index n, and the coefficient of extinction k relative to the reflection surface Refl are such that the refractive index n<1.0, and the coefficient of extinction k≥0.0, or n≥1.0, and coefficient of extinction k≥0.5. FIG. 6 illustrates the optical path in the XZ section of the light flux that is reflected from the reflection mirror 15 and is incident on the reflection mirror 15 when the reflection member 22 is provided on the rear surface.

Figure 7:
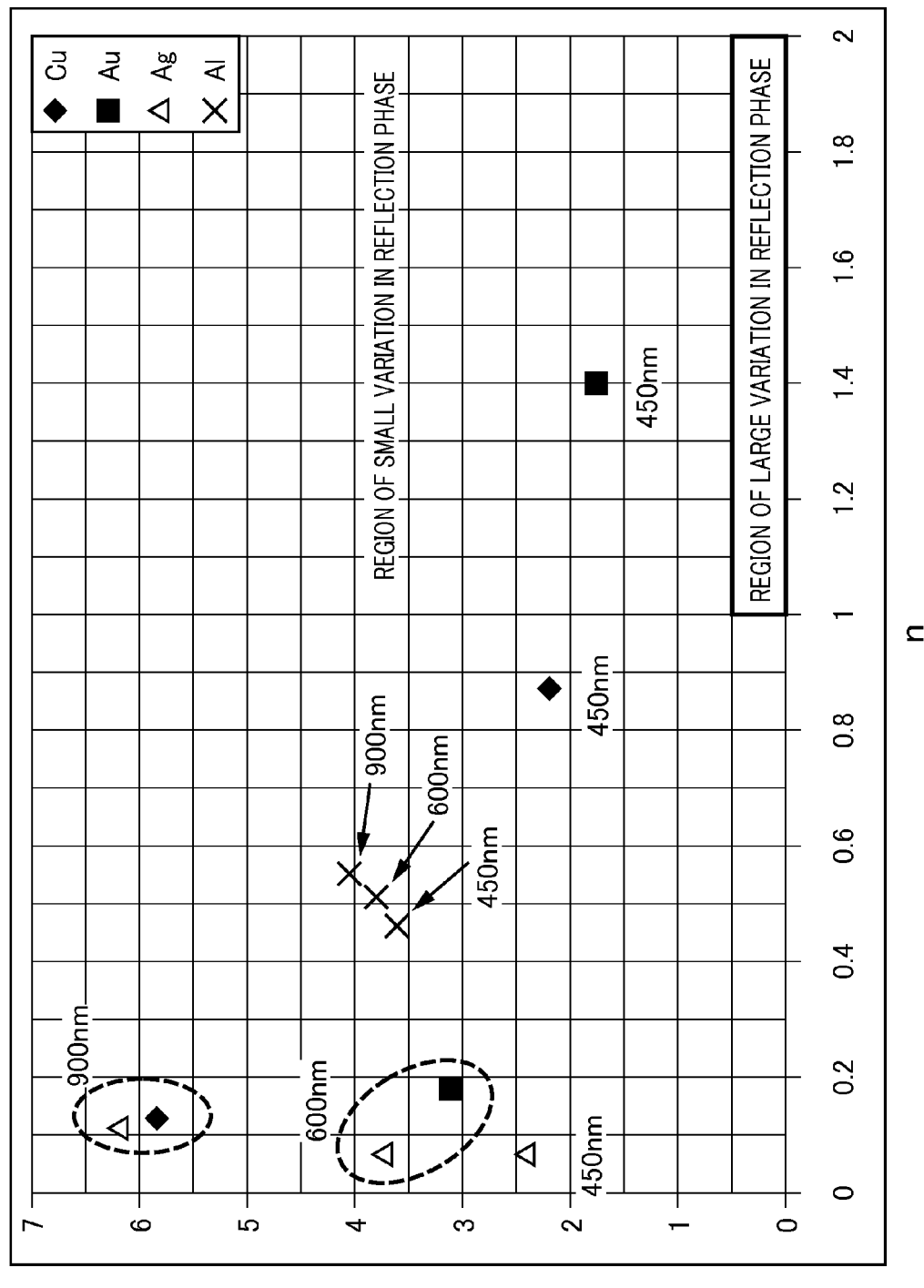
FIG. 7 is a diagram illustrating a reflection phase, a coefficient and a refractive index of the substance.

FIG. 7 is a graph illustrating the angle dependency of the polarization phase relative to the refractive index n, and the coefficient of extinction k. As illustrated in FIG. 7, when the reflection member 22 that is actually manufactured from a substance that exhibits a refractive index n, and a coefficient of extinction k that are within the above ranges is provided on the reflection mirror 15, the angle dependency of the phase change of the reflection surface Refl is reduced. Therefore, the sensitivity to the angle of the phase change on the reflection surface Refl is reduced by the reflection member 22 according to the present embodiment, and as a result, the phase difference in the respective light beams is reduced, and consequently, it is possible to improve the symmetry characteristics exhibited by the alignment signal.

A substance for the reflection member 22 that satisfies the conditions above in relation to the refractive index n, and the coefficient of extinction k for example may be a metallic substance such as Ag, Al, Cu, Au, or the like. When Ag, Al, Cu, or Au is used, the refractive index n, and the coefficient of extinction k at a frequency of 450 nm, 600 nm, 900 nm are as illustrated in Table 1.

TABLE 1

|  | Cu | | Au | | Ag | | Al | |
| --- | --- | --- | --- | --- | --- | --- | --- | --- |
| (nm) | n | k | n | k | n | k | n | k |
| 450 | 0.87 | 2.20 | 1.40 | 1.75 | 0.06 | 2.42 | 0.46 | 3.61 |
| 600 | 0.17 | 3.07 | 0.18 | 3.10 | 0.06 | 3.75 | 0.51 | 3.80 |
| 900 | 0.13 | 5.86 | | | 0.11 | 6.22 | 0.55 | 4.06 |

However, when using Cu or Au, the reflectance at short wavelength bands in proximity to 400 nm exhibits a rapid decrease, and as a result, the substance for use in relation to the reflection member 22 must be determined depending on the wavelength to be used. In this manner, the substance for the reflection member 22 can be adapted and changed in response to the wavelength of the light flux, to thereby enable adjustment by a user to an optimal refractive index n, and coefficient of extinction k.

In addition, the optimal refractive index n, and the coefficient of extinction k imparted to the reflection surface Refl varies according to the glass material used in the reflection mirror 15. However, the angle dependency of the polarization phase can be reduced even when using an arbitrary glass material by selection of a reflection member 22 that satisfies the conditions for n, and k above.

Figure 8:
FIG. 8 is a diagram illustrating a reflection phase and an angle of incidence of the reflection mirror according to an exemplary embodiment of the present invention.
Figure 9:
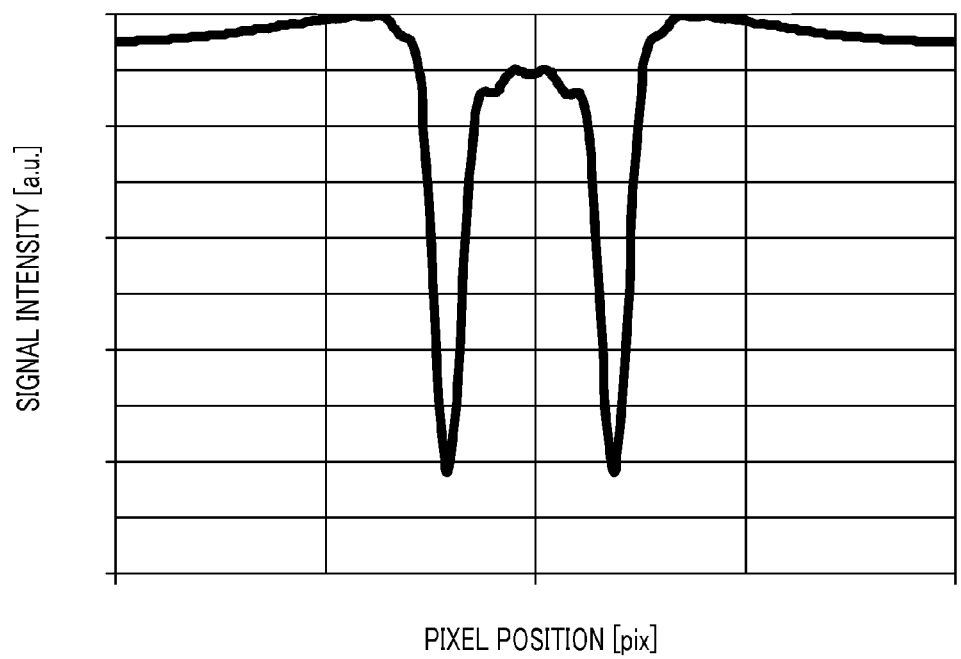
FIG. 9 is a diagram illustrating an alignment detection waveform according to an exemplary embodiment of the present invention.

FIG. 8 illustrates the reflection phase and the angle of incidence to the reflection mirror 15 that includes the reflection member 22 when Ag is adopted as the material for the reflection member 22 and the alignment wavelength is 600 nm. FIG. 9 illustrates the alignment mark signal of the configuration in FIG. 8. As illustrated in FIG. 8, the angle dependency of the polarization phase when using a reflection member 22 configured from a substance that satisfies the conditions for n and k is reduced in comparison to a configuration which does not use the reflection member 22. Furthermore, as illustrated in FIG. 9, the symmetry of the alignment mark signal is improved in comparison to the graph in FIG. 5 when the reflection member 22 is not used. In this manner, the symmetry of the alignment mark signal can be improved as a result of reducing the angle dependency of the polarization phase through adoption of a substance that satisfies n and k as the reflection member 22 used on the reflection surface Refl.

In this exemplary embodiment of the present invention, an example has been described in which a light flux passes through glass of a reflection mirror 15 (optical member inter portion) and is reflected on the rear surface side of the glass. However, the symmetry of the alignment mark signal can be improved in the same manner by an optical system in which light passes through air and is reflected by a glass surface (front surface side) of a reflection mirror 15.

In this exemplary embodiment of the present invention, an alignment mark detection optical system has been described in which an alignment mark AM is illuminated and an image of the mark AM formed by detection light ML is detected by an image detection element 20. However, the same effect can be obtained by a configuration in which another type of alignment mark detection optical system is provided with a reflection member 22 according to the present invention.

Article Manufacturing Method

An article manufacturing method according to an embodiment of the present invention is preferred in manufacturing an article such as a micro device such as a semiconductor device or the like, an element or the like having a microstructure, or the like. The article manufacturing method may include a step of forming a pattern (e.g., latent image pattern) on an object (e.g., substrate on which a photosensitive material is coated) using the aforementioned lithography apparatus; and a step of processing (e.g., step of developing) the object on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. For example, in the above embodiments, a description has been given of an exemplary exposure apparatus 1 using ultraviolet light, vacuum ultraviolet light or extreme ultraviolet light as a lithography apparatus. However, the lithography apparatus is not limited thereto but may also be a lithography apparatus including a movable stage for holding an original plate or a substrate. For example, the lithography apparatus may also be a lithography apparatus that performs writing on a substrate with a charged particle beam such as an electron beam to thereby form a pattern on the substrate or may also be an imprint apparatus that forms (molds) an imprint material on a substrate using a mold to thereby form a pattern on the substrate.

This application claims the benefit of Japanese Patent Application No. 2012-184543 filed Aug. 23, 2012, which is hereby incorporated by reference herein in its entirety.

What is claimed is:

1. A mark detector for detecting a mark, the mark detector comprising:
    an optical system configured to detect the mark and including:
        a lens that has a positive refractive power;
        a reflection portion composed of a transparent first material; and
        a reflection member,
    wherein the reflection portion has a reflection surface configured to reflect an incident light that passes through the transparent first material, where the incident light is in a convergent or divergent state,
    wherein the reflection member is made of a second material different from the first material and is disposed behind the reflection surface of the reflection portion, and
        wherein the second material is at least one of a material that exhibits a refractive index of less than 1.0 and greater than 0.0 and an extinction coefficient of greater than 0.0 or a material that exhibits a refractive index of greater than 1.0 and an extinction coefficient of greater than 0.5.

2. The mark detector according to claim 1, wherein the second material includes Ag, Al, Cu, or Au.

3. The mark detector according to claim 1, further comprising:
    a first lens group and a second lens group including a plurality of lenses,
    wherein the first lens group includes the lens that has a positive refractive power, the first lens group and the second lens group being disposed in sequence from the mark to be detected, and the reflection portion being provided between the first lens group and the second lens group.

4. The mark detector according to claim 1, wherein the reflection surface of the reflection portion reflects incident light beams having different incident angles.

5. The mark detector according to claim 1, wherein:
    the reflection portion is made of glass, and
    the refractive index and the extinction coefficient imparted to the reflection member depends on a glass material of the reflection portion.

6. The mark detector according to claim 1, wherein phase changes of light beams reflected by the reflection surface, which depend on incident angles of the incident light beams, are reduced.

7. A lithography apparatus that forms a pattern on a substrate, the lithography apparatus comprising:
    a holder configured to be movable while holding the substrate; and
    a mark detector configured to detect a mark formed on the substrate that is held by the holder,
    wherein the mark detector comprises:
        an optical system configured to detect the mark and including:
            a lens that has a positive refractive power;
            a reflection portion composed of a transparent first material; and
            a reflection member,
        wherein the reflection portion has a reflection surface configured to reflect an incident light that passes through the transparent first material, where the incident light is in a convergent or divergent state,
        wherein the reflection member is made of a second material different from the first material and is disposed behind the reflection surface of the reflection portion, and
        wherein the second material is at least one of a material that exhibits a refractive index of less than 1.0 and greater than 0.0 and an extinction coefficient of greater than 0.0 or a material that exhibits a refractive index of greater than 1.0 and an extinction coefficient of greater than 0.5.

8. A method for manufacturing a device using a lithography apparatus that forms a pattern on a substrate,
    wherein the lithography apparatus comprises:
        a holder configured to be movable while holding the substrate; and
        a mark detector configured to detect a mark formed on the substrate that is held by the holder,
        wherein the mark detector comprises:
            an optical system configured to detect the mark and including:
                a lens that has a positive refractive power;
                a reflection portion composed of a transparent first material; and
                a reflection member,
            wherein the reflection portion has a reflection surface configured to reflect an incident light that passes through the reflection portion, where the incident light flux is in a convergent or divergent state, wherein the reflection member is made of a second material different from the first material and is disposed behind the reflection surface of the reflection portion, wherein the second material is at least one of a material that exhibits a refractive index of less than 1.0 and greater than 0.0 and an extinction coefficient of greater than 0.0 or a material that exhibits a refractive index of greater than 1.0 and an extinction coefficient of greater than 0.5, and wherein the method comprises the steps of:
  forming the pattern onto the substrate using the lithography apparatus, and
  processing the substrate on which the pattern is formed.

* * * * *